(12) United States Patent
Lin

(10) Patent No.: US 10,338,172 B2
(45) Date of Patent: Jul. 2, 2019

(54) POWER DEVICE AND METHOD FOR DRIVING A LOAD

(71) Applicant: KONINKLIJKE PHILIPS N.V., Eindhoven (NL)

(72) Inventor: Yingfeng Lin, Borgerhout (BE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 196 days.

(21) Appl. No.: 15/536,208

(22) PCT Filed: Dec. 15, 2015

(86) PCT No.: PCT/EP2015/079675
§ 371 (c)(1),
(2) Date: Jun. 15, 2017

(87) PCT Pub. No.: WO2016/096774
PCT Pub. Date: Jun. 23, 2016

(65) Prior Publication Data
US 2017/0363698 A1    Dec. 21, 2017

(30) Foreign Application Priority Data

Dec. 18, 2014 (WO) ................ PCT/CN2014/094242
Apr. 20, 2015 (EP) .................................... 15164161

(51) Int. Cl.
*G01R 33/385* (2006.01)
*H02M 1/32* (2007.01)
(Continued)

(52) U.S. Cl.
CPC .......... *G01R 33/3852* (2013.01); *H02M 1/08* (2013.01); *H02M 1/14* (2013.01); *H02M 1/32* (2013.01);
(Continued)

(58) Field of Classification Search
CPC combination set(s) only.
See application file for complete search history.

(56) References Cited

U.S. PATENT DOCUMENTS 5,132,889 A     7/1992  Hitchcock et al.
2009/0058350 A1  3/2009  Wei et al.
(Continued)

FOREIGN PATENT DOCUMENTS

WO     2011024137 A1   3/2011

OTHER PUBLICATIONS

Khadkikar et al "Digital signal processor implementation and performance evaluation of split capacitor, four-leg and three H-bridge-based three-phase four-wire shunt active filters"B, Power Electronics, IET, vol. 4, Issue: 4, Publication Year: 2011.
(Continued)

*Primary Examiner* — Jay Patidar

(57) ABSTRACT

Embodiments of the invention provide a power device. The power device comprises a switch mode power conversion circuit with power semiconductors for driving a load in response to a control signal, a controller coupled to the switch mode power conversion circuit to generate the control signal based on a predetermined current profile to be provided to the load and a maximum junction temperature of the power semiconductors, and a current injector coupled to the switch mode power conversion circuit and the controller for generating an offset current. The switch mode power conversion circuit is controlled to output the predetermined current profile or an adjusted current profile in response to the control signal, and the adjusted current profile has an offset with respect to the predetermined current profile. The offset current is equal to the offset between the adjusted current profile and the predetermined current profile and further summed with the adjusted current profile to generate the predetermined current profile to flow through the load if
(Continued)

the control signal controls the switch mode power conversion circuit to output the adjusted current profile.

15 Claims, 8 Drawing Sheets

(51) Int. Cl.
    *H02M 1/08*     (2006.01)
    *H02M 1/14*     (2006.01)
    *H02M 7/5387*     (2007.01)
    *H03F 3/217*     (2006.01)
    *H02M 1/00*     (2006.01)
    *H02M 7/49*     (2007.01)

(52) U.S. Cl.
    CPC ...... *H02M 7/53871* (2013.01); *H03F 3/2173* (2013.01); *H02M 7/49* (2013.01); *H02M 2001/0048* (2013.01); *H02M 2001/327* (2013.01); *Y02B 70/1491* (2013.01)

(56) References Cited

U.S. PATENT DOCUMENTS

| | | | |
|---|---|---|---|
| 2011/0187369 A1 | 8/2011 | Rivas et al. | |
| 2012/0007571 A1* | 1/2012 | Huisman | G01R 33/3852 323/271 |
| 2012/0068667 A1 | 3/2012 | Hatae | |
| 2012/0068678 A1 | 3/2012 | Hatae | |
| 2013/0127532 A1* | 5/2013 | Huisman | G01R 33/3852 330/251 |
| 2014/0097818 A1 | 4/2014 | Wlodzimierz et al. | |

OTHER PUBLICATIONS

Milanes-Montero, M.I. ; Romero-Cadaval, E. ; Barrero-Gonzalez, F Hybrid Multiconverter Conditioner Topology for High-Power Applications, , Industrial Electronics, IEEE Transactions on vol. 58 , Issue: 6, Publication Year: 2011.

Pereira, R.R. ; da Silva, C.H. ; da Silva, L.E.B. ; Lambert-Torres, G. ; Pinto, J.O.P "New Strategies for Application of Adaptive Filters in Active Power Filters", Industry Applications, IEEE Transactions on, vol. 47, Issue: 3, Publication Year: 2011.

Todeschini, G. ; Emanuel, A.E., Transient Response of a Wind Energy Conversion System Used as Active Filter, Energy Conversion, IEEE Transactions on, vol. 26 , Issue: 2, Publication Year: 2011.

Xiongfei Wang ; Blaabjerg, F. ; Liserre, M. ; Zhe Chen ; Jinwei He ; Yunwei Li "An Active Damper for Stabilizing Power Electronics-Based AC Systems", Power Electronics, IEEE Transactions on, vol. 29 , Issue: 7, Publication Year: 2014.

Jun Wang ; Tiefu Zhao ; Jun Li ; Huang, A.Q. ; Callanan, R. ; Husna, F. ; Agarwal, "Characterization, Modeling, and Application of 10-κV SiC MOSFET, A, Electron Devices" , IEEE Transactions on, vol. 55 , Issue: 8, Publication Year: 2008.

Funaki, T. ; Balda, J.C. ; Junghans, J. ; Kashyap, A.S. ; Barlow, F.D. ; Mantooth, H.A. ; Kimoto, T. ; Hikihara, T,"Power Conversion with SiC Devices at Extremely High Ambient Temperatures", Power Electronics Specialists Conference, 2005. PESC '05. IEEE 36th, Publication Year: 2005.

* cited by examiner

POWER DEVICE AND METHOD FOR DRIVING A LOAD

CROSS REFERENCE TO RELATED APPLICATIONS

This application is a U.S. national phase application of International Application No. PCT/EP2015/079675, filed on Dec. 15, 2015, which claims the benefit of International Application Serial Nos. PCT/CN2014/094242 filed Dec. 18, 2014 and EP15164161.0 filed on Apr. 20, 2015 and are incorporated herein by reference.

FIELD OF THE INVENTION

The invention relates to a power device and method for driving a load, and more particularly to a gradient amplifier system for driving a gradient coil and a magnetic resonance imaging device with the gradient amplifier system.

BACKGROUND OF THE INVENTION

A power semiconductor device is a semiconductor used as a switch or rectifier in power electronics. With the development of metal oxide semiconductor field-effect transistor (MOSFET) and insulated-gate bipolar transistor (IGBT), power semiconductors are more widely used in power devices, e.g., switch mode power suppliers, power amplifiers, and power converters. For a power device, the power dissipated by a power semiconductor is dissipated as heat, which causes the temperature of the power semiconductor to rise. When a junction temperature of the power semiconductor reaches a predetermined maximum junction temperature $T_{JMAX}$, the power device overheats and fails. The junction temperature is the barrier layer temperature of the transistors. In some circumstances, power dissipation is unevenly distributed among power semiconductors of power devices. In order to prevent the failure, the maximum power capacity of the power device must be overly conservative to account for the uneven distribution of power dissipation among the power semiconductors.

One example of such power device is a gradient power amplifier in magnetic resonance imaging (MRI) systems, which generate magnetic field in X, Y, and Z three-axis in order to provide the necessary spatial resolution for the reception of the magnetic resonant signals emitted by the hydrogen protons of an examination object. Various topologies for the gradient amplifier have been proposed to deliver a specified current profile to the gradient coil, such as cascaded full bridge topology with multiple full bridge circuits in a stack configuration, or multiple bridge power conversion topology with multiple full bridge circuits connected in parallel at their input/outputs.

FIG. 1A illustrates a schematic diagram of a conventional full bridge circuit 100. FIG. 1B illustrates an exemplary current profile 110 flowing through the gradient coil. The modulation scheme of the full bridge circuit 100 used in gradient amplifiers of various topologies controls the current profile 110 flowing through the gradient coil. For the purpose of brevity, only full bridge circuit 100 is shown in FIG. 1A to illustrate the relationship between the modulation scheme of full bridge circuits and the current profile. However, those skilled in the art would understand that the gradient amplifiers may include multiple full bridge circuits as aforementioned.

Referring to FIG. 1A, the full bridge circuit 100 includes high side power semiconductors 101 and 103, and low side power semiconductors 105 and 107, e.g., IGBTs. The high side and low side power semiconductors 101 and 105 are connected in series at node A to form a first bridge leg. Similarly, the high side and low side power semiconductors 103 and 107 are connected in series at node B to form a second bridge leg. A gradient coil 109 is connected between nodes A and B. The current profile 110 flowing through the gradient coil 109 is illustrated in FIG. 1B. As shown in FIG. 1B, the current profile 110 represents a periodic waveform. During a time duration of T1 of a cycle time, the modulation scheme switches on the high side power semiconductor 101 and the low side power semiconductor 107 and switches off the high side power semiconductor 103 and the low side power semiconductor 105. Due to the modulation scheme of the full bridge circuit 100, the current profile 110 flows through the high side power semiconductor 101, the gradient coil 109 and the low side power semiconductor 107 with a current level I1 during the time duration of T1. During a time duration of T2 of the cycle time, the modulation scheme switches off the high side power semiconductor 101 and the low side power semiconductor 107 and switches on the high side power semiconductor 103 and the low side power semiconductor 105. Due to the modulation scheme of the full bridge circuit 100, the current profile 110 flows through the high side power semiconductor 103, the gradient coil 109 and the low side power semiconductor 105 with a current level I2. As such, power dissipation across each of the power semiconductors 101 through 107 is determined by the current level and time duration of the current flowing through each power semiconductor. More specifically, the average power dissipation across each of the power semiconductors 101 and 107 is given by equation (1):

$$P\text{avg}_1=(K\text{cond}\times I1+K\text{sw}\times I1)\times D \quad (1)$$

The average power dissipation across each of the power semiconductors 103 and 105 is given by equation 2:

$$P\text{avg}_2=(K\text{cond}\times I2+K\text{sw}\times I2)\times(1-D) \quad (2)$$

where Kcond is the conduction loss coefficient of the power semiconductors, Ksw is the switching loss coefficient of the power semiconductors and D is the duty cycle of the modulation scheme given by equation (3)

$$D=T1/(T1+T2) \quad (3)$$

According to equations (1) and (2), the power dissipation of the full bridge circuit 100 is unevenly distributed among the power semiconductors 101 through 107 for the current profile 110 with long time duration T1 and short time duration T2. Uneven power dissipation can lead to different temperature rise across each power semiconductor according to equation (4):

$$Z(t)=(T_J(t)T_C(t))/P \quad (4)$$

where Z(t) represents the thermal impedance at time t, $T_J(t)$ represents the junction temperature at time t, $T_C(t)$ represents the case temperature of the module case in operation at time t, and P represents the power dissipation. Since each semiconductor is packaged inside the gradient amplifier, they share a common case temperature Tc(t). Due to uneven power dissipation with long time duration T1 and short time duration T2 of the current profile 110, the temperature of the power semiconductors 101 and 107 will reach the predetermined maximum junction temperature $T_{JMAX}$ much earlier than those of the power semiconductors 103 and 105. To prevent failure of power semiconductors, gradient amplifier's maximum output capacity is limited to account for different temperature rise resulting from uneven power dissipation.

SUMMARY OF THE INVENTION

It is an object of the invention to alleviate uneven power dissipation in power devices to prevent failure of power semiconductors and/or enhance maximum power capacity of power devices.

This object is achieved by a power device according to claim 1.

This object is also achieved by a method according to claim 8.

This object is also achieved by a gradient amplifier system according to claim 12.

This object is also achieved by a magnetic resonance imaging device according to claim 15.

Embodiments of the invention provide a power device, a method for operating a power device, a gradient amplifier system and a magnetic resonance imaging device in the independent claims. Embodiments of the invention are given in the dependent claims. Embodiments of the invention adjust a power output of a power stage in a power device based on a maximum junction temperature $T_{JMAX}$ of power semiconductors in the power stage, and therefore redistribute the power dissipation among the power semiconductors in the power stage to prevent failure of power semiconductors. Furthermore, to keep an output of the power device unchanged to a predetermined current profile, a separate current injector is incorporated to compensate for the power output adjustment of the power stage. As such, uneven power dissipation in power devices is alleviated in a simple manner to prevent failure of power semiconductors. Hereby maximum power capacity of power devices is enhanced.

Embodiments of the invention provide a power device. The power device comprises a switch mode power conversion circuit with power semiconductors for driving a load in response to a control signal, a controller coupled to the switch mode power conversion circuit to generate the control signal based on a predetermined current profile to be provided to the load and a maximum junction temperature of the power semiconductors, and a current injector coupled to the controller for generating an offset current in response to the control signal. The switch mode power conversion circuit is controlled to output the predetermined current profile or an adjusted current profile in response to the control signal, and the adjusted current profile has an offset with respect to the predetermined current profile. The offset current is equal to the offset between the adjusted current profile and the predetermined current profile and further summed with the adjusted current profile to generate the predetermined current profile to flow through the load if the control signal controls the switch mode power conversion circuit to output the adjusted current profile. Advantageously, by adjusting the predetermined current profile, uneven power dissipation in power devices is alleviated to prevent failure of power semiconductors. Hereby maximum power capacity of power devices is also enhanced. In addition, the switch mode power conversion circuit of various topologies can be easily upgraded to enhance the output power capacity without complicated system redesign simply by incorporating the current injector according to the present invention.

According to one embodiment of the present invention, the power semiconductors have uneven power dissipation distribution, and wherein the power semiconductors have balanced power dissipation distribution if the switch mode power conversion circuit outputs the adjusted current profile. Advantageously, as long as the maximum junction temperature $T_{JMAX}$ is not reached when the switch mode power conversion circuit outputs the predetermined current profile, uneven power dissipation is tolerated to minimize the impact of the current injector on the load current. Otherwise, power dissipation among the semiconductors is redistributed to prevent failure of power semiconductors.

According to one embodiment of the present invention, the predetermined current profile has a time duration of T1 during which the predetermined current profile flows through the load with a current level I1, and a time duration of T2 during which the predetermined current profile flows through the load with a current level I2 in a direction opposite to the current direction during the time duration of T1. Furthermore, the offset of the adjusted current profile with respect to the predetermined current profile is determined based on Ios=I1*D−I2(1−D) where D=T1/(T1+T2). Advantageously, balanced power dissipation among the power semiconductors is achieved, and meanwhile, output of the power device is kept unchanged to the predetermined current profile.

According to one embodiment of the present invention, the power semiconductors are connected in a cascaded full bridge topology with a plurality of full bridge circuits in a stack configuration or a multiple bridge power conversion topology with the full bridge circuits connected in parallel. Advantageously, the power semiconductors in the bridge circuits of various topologies, e.g., in stack configuration or parallel coupled bridges, spend very little time in the high dissipation transitions, which minimizes wasted energy work and therefore converts power efficiently.

According to one embodiment of the present invention, the controller further comprises a control signal generator which determines whether a temperature of at least one of the power semiconductors reaches the maximum junction temperature if the switch mode power conversion circuit outputs the predetermined current profile and generates the control signal according to the determination, and an offset current calculator coupled to the control signal generator and for calculating the offset of the adjusted current profile with respect to the predetermined current profile.

According to one embodiment of the present invention, the current injector further comprises an inverter configured to output a first voltage based on the offset of the adjusted current profile with respect to the predetermined current profile, a transformer coupled to the inverter for boosting the first voltage to a second voltage higher than a voltage across the load, and an inductor circuit driven by the second voltage to generate the offset current.

According to one embodiment of the present invention, current ripples of the offset current outputted by the current injector are generated to cancel current ripples of the adjusted current profile during a transient stage. Advantageously, due to the current ripple cancellation between the offset current and current output of the power device with the adjusted current profile, approximately no negative impact upon the load current with the predetermined current profile.

Embodiments of the invention provide a method for operating a power semiconductor device. The method comprises the steps of generating a control signal based on a predetermined current profile and a maximum junction temperature of power semiconductors of a switch mode power conversion circuit in the power semiconductor device, controlling the switch mode power conversion circuit to output the predetermined current profile or an adjusted current profile which has an offset with respect to the predetermined current profile in response to the control signal, performing the following steps if the control signal controls the switch mode power conversion circuit to output the adjusted current profile, generating an offset current equal to the offset between the adjusted current profile and the predetermined current profile, and summing the offset current with the adjusted current profile to generate the predetermined current profile to flow through the load.

According to one embodiment of the present invention, the power semiconductors have uneven power dissipation distribution if the switch mode power conversion circuit outputs the predetermined current profile, and wherein the power semiconductors have balanced power dissipation distribution if the switch mode power conversion circuit outputs the adjusted current profile.

According to one embodiment of the present invention, the predetermined current profile has a time duration of T1 during which the predetermined current profile flows through the load with a current level I1, and a time duration of T2 during which the predetermined current profile flows through the load with a current level I2 in a direction opposite to the current direction during the time duration of T1, and wherein the offset of the adjusted current profile with respect to the predetermined current profile is determined based on Ios=I1*D−I2(1−D) where D=T1/(T1+T2).

According to one embodiment of the present invention, the method further comprises the steps of determining whether a temperature of at least one of the power semiconductors exceeds the maximum junction temperature if the switch mode power conversion circuit outputs the predetermined current profile, generating the control signal according to the determination, and calculating the offset of the adjusted current profile with respect to the predetermined current profile if the control signal controls the switch mode power conversion circuit to output the adjusted current profile.

Embodiments of the invention provide a gradient amplifier system for driving a gradient coil in a magnetic resonance imaging device. The gradient amplifier system comprises a gradient amplifier including a plurality of the power semiconductors for outputting a gradient current, a controller coupled to the gradient amplifier for controlling a current profile of the gradient current, wherein the controller determines the current profile of the gradient current to be a predetermined current profile or an adjusted current profile based on a maximum junction temperature of the semiconductor components, and wherein the adjusted current profile has an offset with respect to the predetermined current profile, and a current injector coupled to the gradient amplifier and the controller for generating an offset current equal to the offset between the adjusted current profile and the predetermined current profile, wherein the offset current and the adjusted current profile are summed to generate the predetermined current profile to flow through the gradient coil if the gradient amplifier outputs the gradient current with the adjusted current profile.

According to one embodiment of the present invention, the gradient amplifier further comprises a switch mode power stage with a plurality of bridge circuits composed of the power semiconductors, each bridge circuit including a high-side power semiconductor and a low-side power semiconductor coupled in series.

According to one embodiment of the present invention, the predetermined current profile has a time duration of T1 during which the predetermined current profile flows through the gradient coil with a current level I1, and a time duration of T2 during which the predetermined current profile flows through the gradient coil with a current level I2 in a direction opposite to the current direction during the time duration of T1, and wherein the offset of the adjusted current profile with respect to the predetermined current profile is determined based on Ios=I1*D−I2(1−D) where D=T1/(T1+T2).

Embodiments of the invention provide a magnetic resonance imaging device comprising the gradient amplifier system as described previously.

These and other aspects of the invention will be apparent from and elucidated with reference to the embodiments described hereinafter.

DESCRIPTION OF THE DRAWINGS

The above and other objects and features of the present invention will become more apparent from the following detailed description considered in connection with the accompanying drawings, in which.

The same reference numerals are used to denote similar parts throughout the figures.

DETAILED DESCRIPTION

Detailed description of the present invention is given below in connection with the accompanying drawings.

Figure 1A:
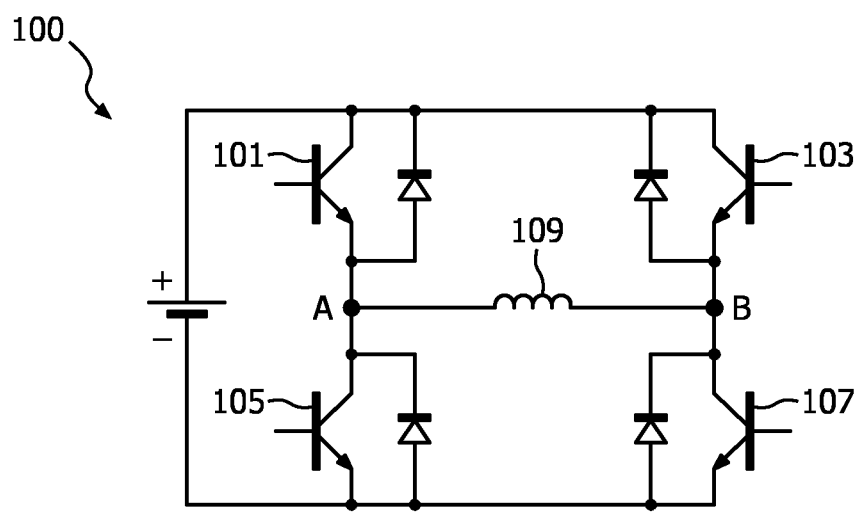
FIG. 1A illustrates a schematic diagram of a conventional full bridge circuit.
Figure 1B:
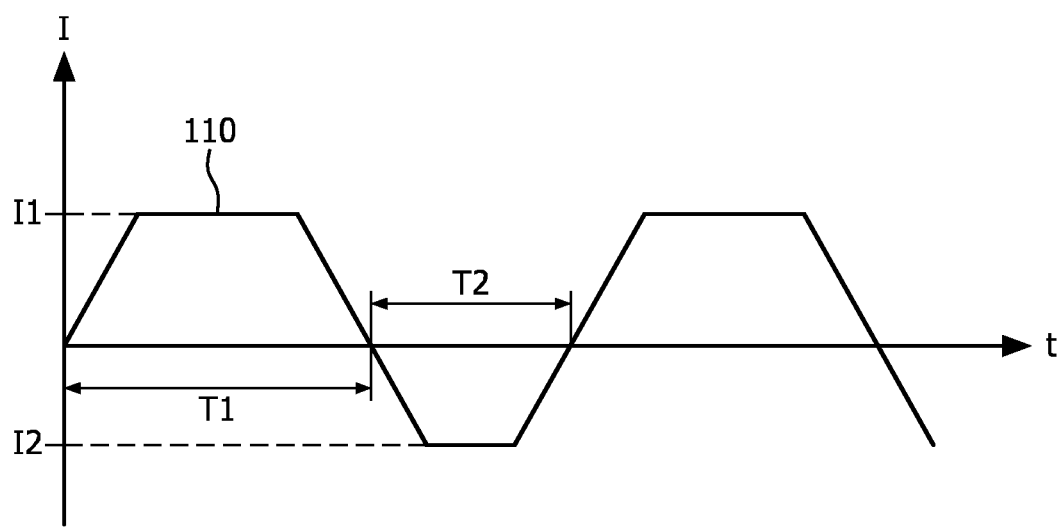
FIG. 1B illustrates an exemplary current profile flowing through a gradient coil.
Figure 2:
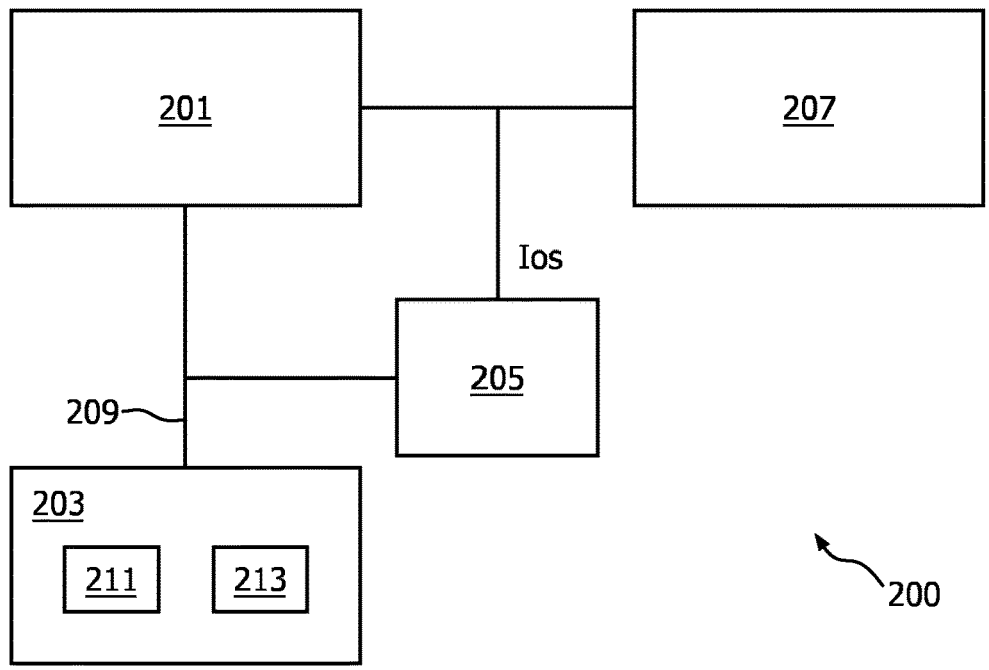
FIG. 2 illustrates a block diagram of a power device according to one embodiment of the present invention.

FIG. 2 illustrates a block diagram of a power device 200 according to one embodiment of the present invention. The power device 200 can be, but not limited to, a power supply, a power amplifier or a power converter, each of which includes a switch mode power conversion circuit using power semiconductors as switches. In the embodiment of FIG. 2, the power device 200 includes a switch mode power conversion circuit 201 including multiple power semiconductors (not shown in FIG. 2), a controller 203, a current injector 205 and a load 207. The power semiconductors are connected in a cascaded full bridge topology with multiple full bridge circuits 100 in a stack configuration, or a multiple bridge power conversion topology with multiple full bridge circuits 100 connected in parallel at their input/outputs. The controller 205 generates a control signal 209 based on a predetermined current profile and a maximum junction temperature $T_{MJX}$ of the power semiconductors included in the switch mode power conversion circuit 201. The switch mode power conversion circuit 201 is coupled to the controller 203 to receive the control signal 209. In response to the control signal 209, the switch mode power conversion circuit 201 drives the load 207 by providing either the predetermined current profile or an adjusted current profile.

Figure 3A:
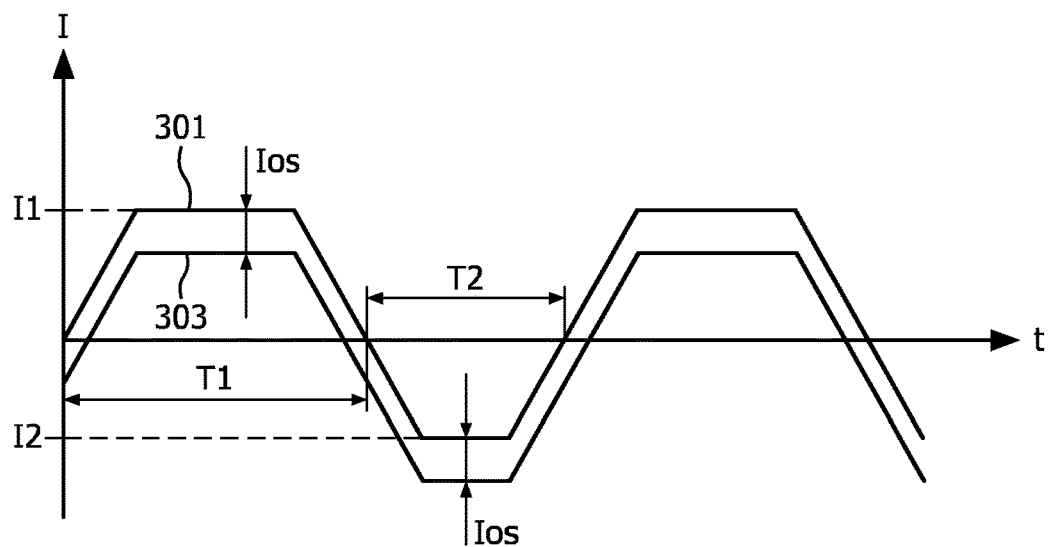
FIG. 3A illustrates a waveform of the current profile outputted from a switch mode power conversion circuit in FIG. 2 according to one embodiment of the present invention.

FIG. 3A illustrates a waveform of the current profile outputted from the switch mode power conversion circuit 201. As shown in FIG. 3A, a waveform 301 represents the predetermined current profile, and a waveform 303 represents the adjusted current profile. The waveform 301 of the predetermined current profile has a time duration of T1 during which the predetermined current profile flows through the load 207 with a current level I1, and a time duration of T2 during which the predetermined current profile flows through the load 207 with a current level I2 in a direction opposite to the current direction during the time duration of T1. The current during the time period T1 is referred to as a positive current and the current during the time period T2 is referred to as a negative current. If the waveform 301 has the long time duration T1 and short time duration T2 as shown in FIG. 3A, the waveform 303 is achieved by moving the waveform 301 vertically down. Similarly, if the waveform 301 has the long time duration T2 and short time duration T1, the waveform 303 is achieved by moving the waveform 301 vertically up. As such, the adjusted current profile has an offset with respect to the predetermined current profile to achieve the average positive current equal to the average negative current.

As aforementioned, if the predetermined current profile with the long time duration T1 and short time duration T2 flows through the power semiconductors in the switch mode power conversion circuit 201, power dissipation will unevenly distributed among the power semiconductors. Advantageously, with the adjusted current profile, the long-time duration T1 is shortened while the short time duration T2 is prolonged. As such, power dissipation among the power semiconductors is redistributed to alleviate the power dissipation unbalance. Preferably, the adjusted current profile is shifted with respect to the predetermined current profile by an amount of offset Ios given according to equation (5):

$$Ios = I1 \times D - I2 \times (1-D) \qquad (5)$$

With the offset Ios of the adjusted current profile from the predetermined current profile, the power semiconductors of the switch mode power conversion circuit 201 achieves a balanced distribution of power dissipation. Due to the even distribution of power dissipation, the junction temperature rise is also evenly distributed. Accordingly, the power capacity of the switch mode power conversion circuit 201 is enhanced.

Referring back to FIG. 2, to adjust the predetermined current profile properly, the controller 203 further includes a control signal generator 211 and an offset current calculator 213. The control signal generator 211 determines whether a temperature of at least one of the power semiconductors in the switch mode power conversion circuit 201 will reach the maximum junction temperature $T_{JMAX}$ if the switch mode power conversion circuit 201 outputs the predetermined current profile and generates the control signal according to the determination. More specifically, if the maximum junction temperature $T_{JMAX}$ is not reached, the controller 203 controls the switch mode power conversion circuit 201 to output the predetermined current profile 301 by controlling the modulation scheme of the power semiconductors. Otherwise, the switch mode power conversion circuit 201 outputs the adjusted current profile 303 by controlling the modulation scheme of the power semiconductors. If the switch mode power conversion circuit 201 outputs the adjusted current profile 303, the offset current calculator 213 further calculates the amount of the offset Ios according to equation (5) to achieve the balanced power dissipation among the power semiconductors.

Figure 3B:
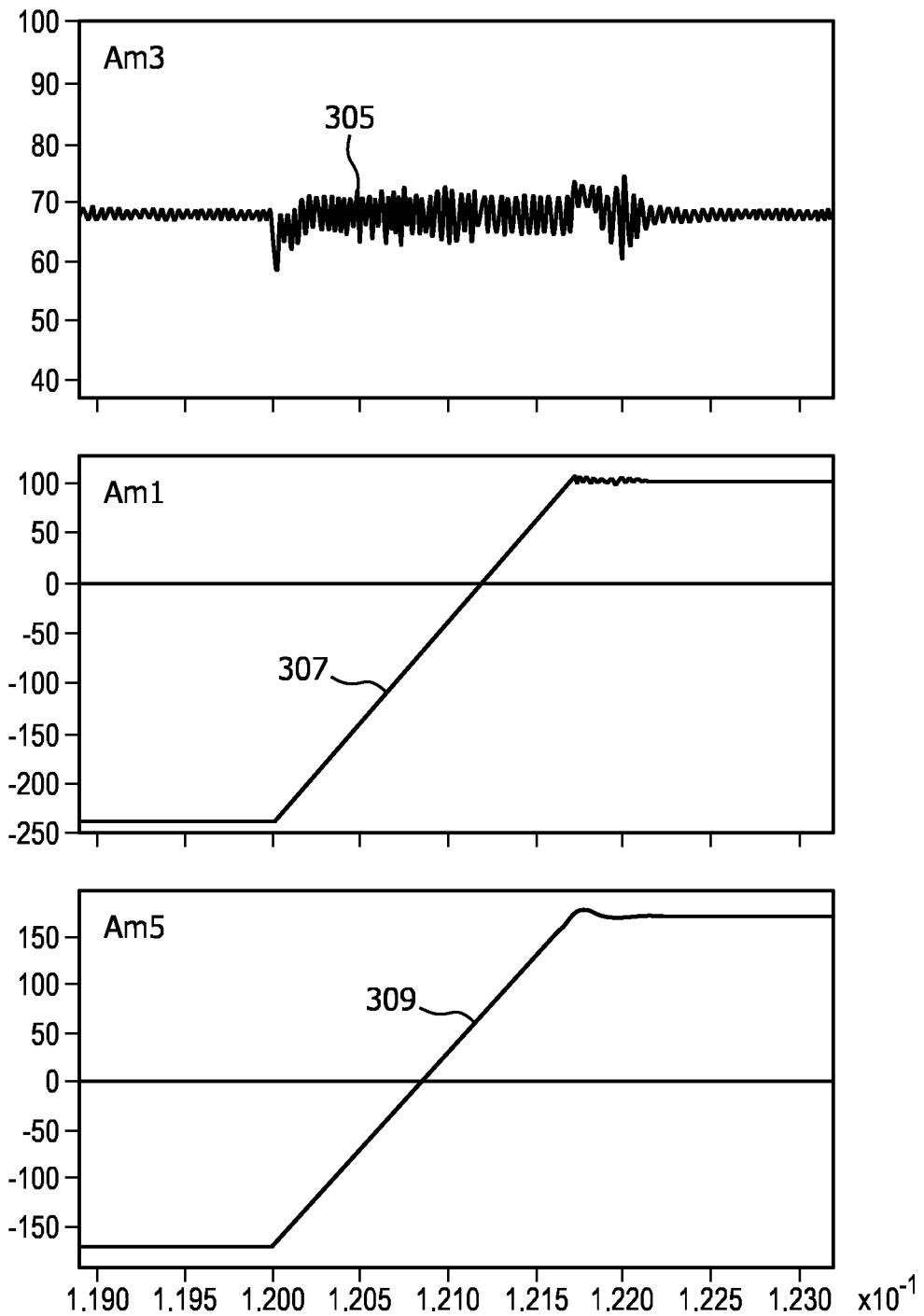
FIG. 3B illustrates current waveforms at the transient stage according to one embodiment of the present invention.

Furthermore, to keep the current flowing through the load 207 the same under both circumstances, the current injector 205 is coupled to the controller 203 and the switch mode power conversion circuit 201 to generate an offset current equal to the offset Ios between the adjusted current profile and the predetermined current profile. The offset current is hereafter referred to as Ios. If the control signal 209 controls the switch mode power conversion circuit 201 to output the adjusted current profile, the offset current Ios and the adjusted current profile are summed to generate the predetermined current profile to flow through the load 207. Moreover, considering the current ripples during a transient stage, the offset current Ios outputted by the current injector 205 includes current ripples to cancel the current ripples of the adjusted current profile during the transient stage. FIG. 3B illustrates the waveform 305 of the offset current Ios, the waveform 307 of the adjusted current profile and the waveform 309 of the predetermined current profile, at the transient stage. As shown in FIG. 3B, due to the current ripple cancellation between the offset current and current output of the power device 200 which represents the adjusted current profile, approximately no negative impact upon the load current which represents the predetermined current profile.

Moreover, the current injector 205 can be easily integrated with the switch mode power conversion circuit 201 of various topologies to enhance the output power capacity. In addition, the current injector 205 can be only activated when the maximum junction temperature $T_{JMAX}$ is reached to decrease the impact of the introduction of the current injector to the gradient coil current.

Figure 4:
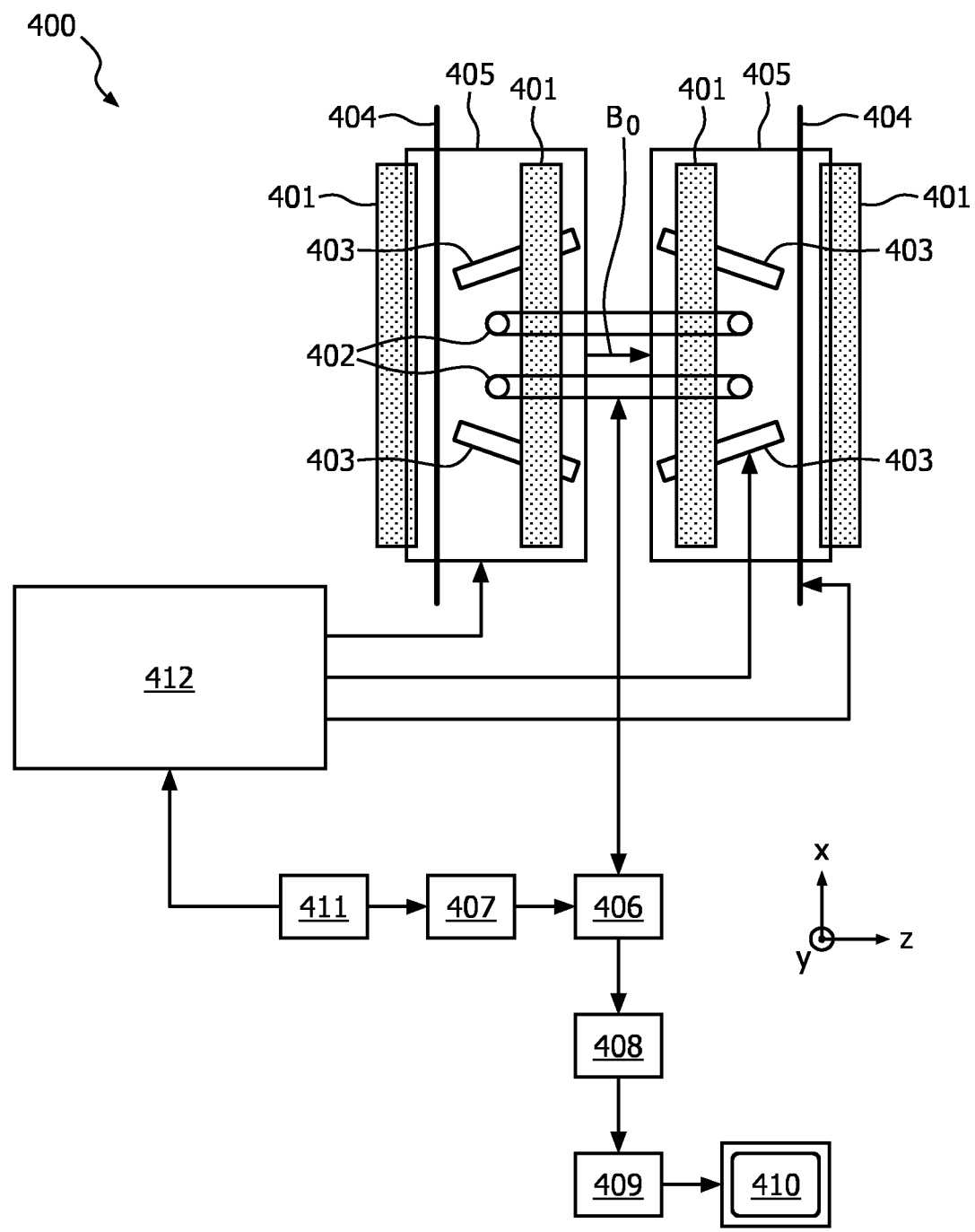
FIG. 4 illustrates a diagram of a magnetic resonance imaging device according to one embodiment of the present invention.

One example of the power device according to FIG. 2 is the gradient amplifier used in a magnetic resonance imaging device. As shown in FIG. 4, the magnetic resonance imaging device 400 comprises a main magnet system 401 for generating an essentially uniform and steady main magnetic field $B_0$ in the z-direction for aligning the nuclear spins in a subject to be imaged. An RF/MR transmit/receive antenna arrangement 402 is provided for transmitting RF signals for generating an RF magnetic alternating field $B_1$ for exciting nuclear magnetic resonances and for receiving subsequent MR relaxation signals from the related nuclei of the subject to be imaged. For the spatial selection and spatial encoding of the received MR relaxation signals emanating from the excited nuclei, the system also comprises gradient coils 403, 404, 405 by which gradient magnetic fields in the orthogonal x-, y- and z-directions, respectively.

Further, the magnetic resonance imaging device 400 comprises a device controller 411 which during RF transmission controls an RF transmitter unit 407 for generating the RF signals which are fed via an RF transmit/receive circuit 406 to the RF antenna arrangement 402. The received MR relaxation signals are fed via the RF transmit/receive circuit 406 to an amplifier and demodulator unit 408 and are processed by means of a processing unit 409 for generating an MR image of the examination subject on a display unit 410. Further, during the MR signal reception, the device controller 411 generates control signals to a gradient amplifier system 412 to implement the modulation scheme, which controls the gradient amplifier system 412 to output a predetermined current profile. The predetermined current profile enables gradient magnetic field coils to select a desired slice or volume within the examination object to be imaged on the display unit 410. Advantageously, if the predetermined current profile goes to extreme to have the temperature of one of the power semiconductors reach the maximum junction temperature $T_{JMAX}$, the gradient amplifier system 412 according to embodiments of the present invention can redistribute the power dissipation among the power semiconductors used in power stage of the gradient amplifier system 412, which will be described in more details with respect to FIG. 5.

Figure 5:
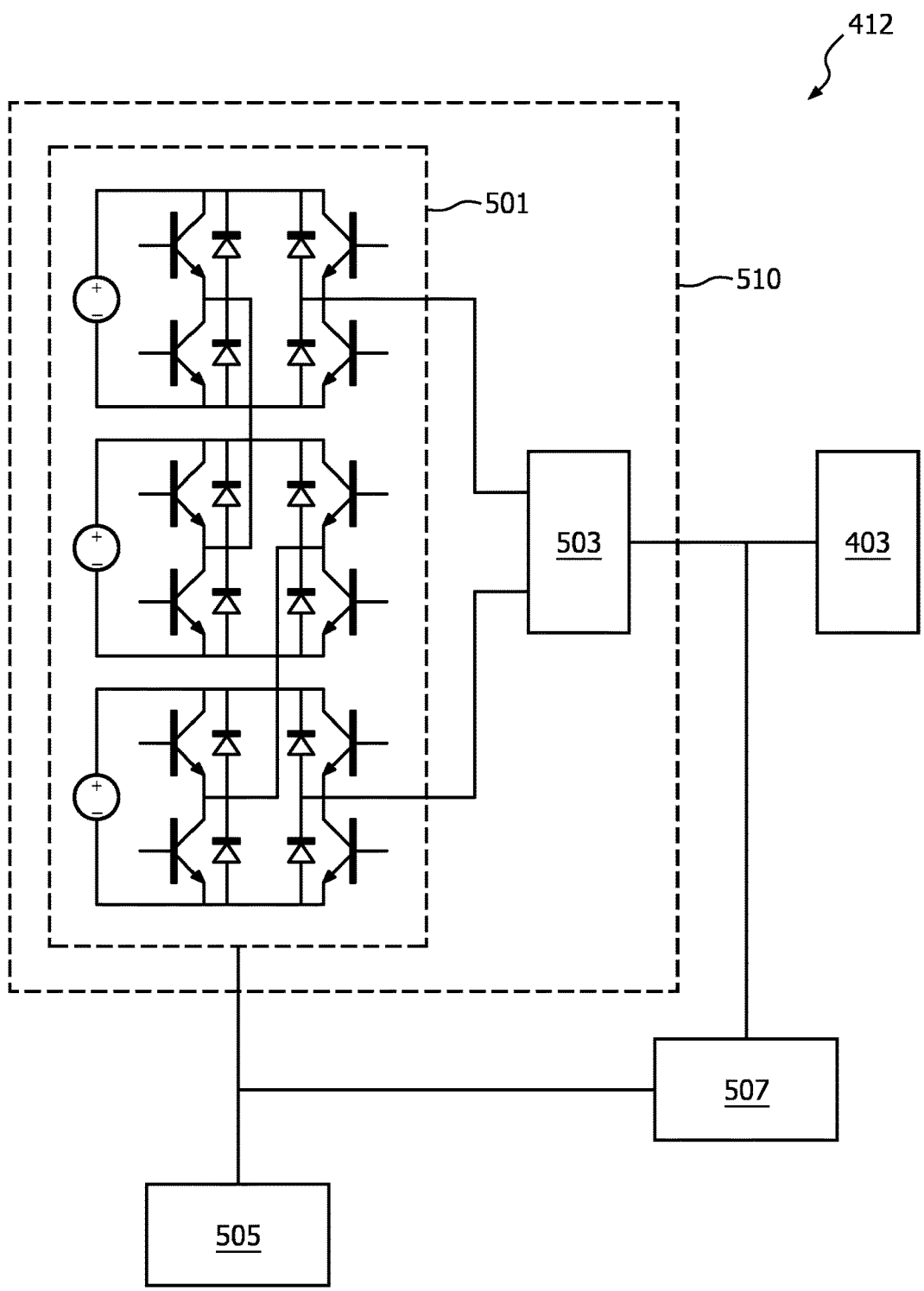
FIG. 5 illustrates a schematic diagram of a gradient amplifier system in FIG. 4 according to one embodiment of the present invention.

FIG. 5 illustrates a schematic diagram of the gradient amplifier system 412 according to one embodiment of the present invention. The gradient amplifier system 412 includes a gradient amplifier 510, a controller 505 and a current injector 507. In the embodiment of FIG. 5, the gradient amplifier 510 further includes an inverter power stage 501 built with a stack of three bridges with interleaved operation. Alternatively, the inverter power stage 510 can be built with multiple bridges connected in parallel at their input/outputs. The inverter power stage 501 generates harmonic current along with the current output. In order to eliminate the harmonic current, as shown in FIG. 5, the filter 503 is coupled between the inverter power stage 501 and the gradient coil 403.

As discussed in relation to FIG. 4, the control signals from the device controller 411 controls the gradient amplifier system 412 to implement the modulation scheme, which controls the gradient amplifier system 412 to output the predetermined current profile. More specifically, the controller 505 processes these control signals to determine the current profile to be outputted to the gradient coil 403. The controller 505 further determines whether the maximum junction temperature $T_{JMAX}$ of power semiconductors in the inverter power stage 501 will be reached if the gradient amplifier 510 outputs the predetermined current profile directly. If the maximum junction temperature $T_{JMAX}$ is not reached, the controller 505 will control the gradient amplifier 510 to output the predetermined current profile. Otherwise, the controller 505 will control the gradient amplifier 510 to output the adjusted current profile. In one embodiment, the offset Ios between the predetermined current profile and the adjusted current profile is calculated according to equation (5) as discussed with respect to FIG. 2. In case of outputting the adjusted current profile, the controller 505 further activates the current injector 507 to output the offset current equal to the offset Ios. Hereafter, the offset current equal to the offset Ios is referred to as the offset current Ios. As such, the predetermined current profile is still obtained to flow through the gradient coil 403 by summing the output current of the gradient amplifier 510 with the offset current Ios.

Figure 6:
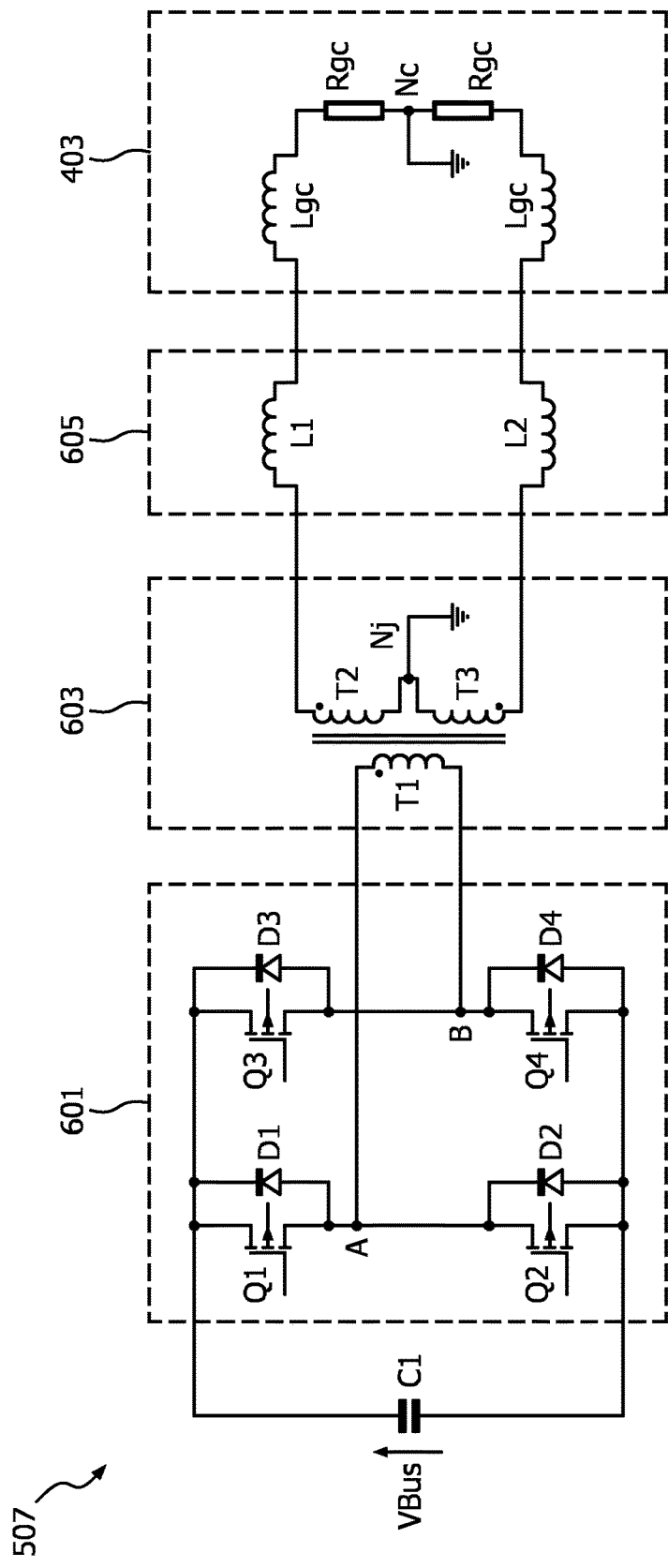
FIG. 6 illustrates an example of the current injector in the gradient amplifier system in FIG. 5 according to one embodiment of the present invention.

FIG. 6 illustrates an example of the current injector 507 used in the gradient amplifier system 412 in accordance with an embodiment of the present invention. In the embodiment of FIG. 6, the current injector 507 includes an inverter 601, a transformer 603, and an inductor circuit 605. In one embodiment, the inverter 601 is a high frequency inverter configured to output a first voltage based on the offset current Ios calculated by the controller 505. The transformer 603 is configured to boost the first voltage to a second voltage higher than the voltage across the gradient coil 403. The inductor circuit 605 is driven by the second voltage to generate the offset current Ios. It should be understand that the illustrated gradient coil 403 consisting of Lgc and Rgc is an equivalent circuit in order to indicate the gradient coil parameters, that is, inductance Lgc and resistance Rgc. The gradient coil physically should be a coil.

As shown in FIG. 6, the output of the inverter 601 is coupled to the primary winding of the transformer 603. The transformer 603 comprises the primary winding T1, a first secondary winding T2 and a second secondary winding T3. The inductor circuit 605 comprises a first inductor L1 and a second inductor L2. In this embodiment, the first secondary winding of the transformer 603, the first inductor of the inductor circuit 605, the gradient coil 403, the second inductor of the inductor circuit 605, and the secondary winding of the transformer 603 are coupled in series sequentially. A junction node Nj of the first and secondary windings of the transformer 603 is coupled to ground, and a central point Nc of the gradient coil 403 is coupled to ground. The illustrated structure may facilitate the control of the current injector 507 in the gradient amplifier system 412 of the MRI system.

In an embodiment, the inverter 601 is a full bridge inverter which is driven by drive signals and outputs a primary voltage VAB across nodes A and B to the transformer 603. As shown in the FIG. 6, the full bridge inverter 601 includes a first half bridge and a second half bridge. The first half bridge includes a high side transistor Q1 and a low side transistor Q2 coupled in series at node A, and the second half bridge includes a high side transistor Q3 and a low side transistor Q4 coupled in series at node B. The transistors are used as high frequency switches to output a voltage with required waveform under the control of the drive signals.

The high side transistor and the low side transistor in each of the first and second half bridges are switched-on alternately by respective drive signals, and the drive signals for the high side transistor in the first half bridge and the low side transistor in the second half bridge have the same duty cycle and a 180° phase shift with each other. And in order to switch on the high side transistor and the low side transistor in each of the first and second half bridges in an alternate way, the drive signals for the high side transistor and the low side transistor in the half bridge should be out of phase, in other words, be opposite in phase.

As shown in FIG. 6, each of the transistors Q1 to Q4 in the full bridge inverter 601 is coupled in parallel with one of diodes D1 to D4. The diodes may be intrinsic body diodes of the transistors or external coupled diodes in order for implementing synchronous drive technology. For example, a pair of switching transistor and diode may be implemented with a MOSFET which includes an intrinsic body diode.

Each of the transistors Q1 to Q4 in the inverter 601 may be coupled to a transistor driver such as a MOSFET driver, which is not shown for sake of brevity. The drivers may be configured to receive the digital drive signals and generate driving signals high enough to switch on the transistors.

The inverter 601 is not limited to the structure of the full bridge inverter as shown in FIG. 6. Alternatively, each half bridge leg can includes multiple high side transistors coupled in parallel and multiple low side transistors couple in parallel. In other words, the full bridge inverter as shown in FIG. 6 can be expanded to include multiple parallel coupled transistors in each bridge leg so as to achieve higher power rating. It should be understood that the inverter 601 is not limited to a specific structure. Other kinds of inverters, such as a multilevel inverter, a neutral-point-clamped (NPC) inverter, or the like, can also be used for the purpose of the present invention.

Additionally, the current injector 507 may comprise a power rectifier, which is not show in FIG. 6 for sake of brevity. The power rectifier may be used to regulate alternating current (AC) voltage into DC bus voltage VBus to provide a DC power supply for the inverter 601.

Figure 7:
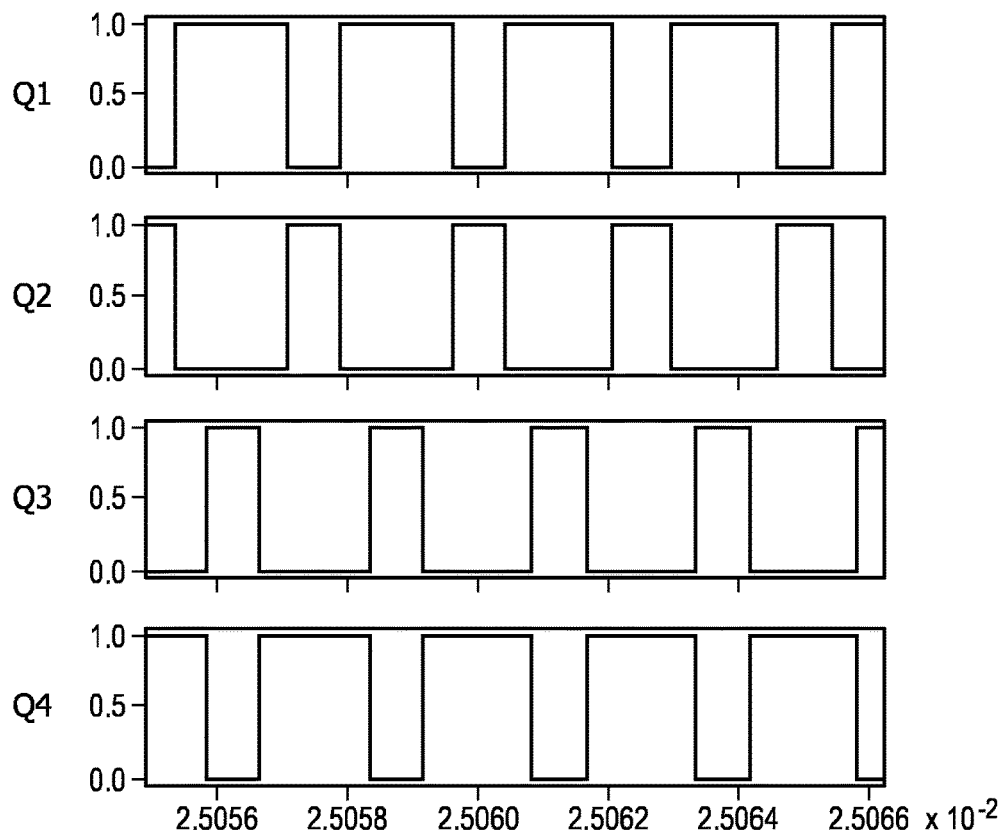
FIG. 7 illustrates exemplary drive signals for driving the switching transistors in the inverter of FIG. 6 according to one embodiment of the present invention.

FIG. 7 illustrates exemplary drive signals for driving the switching transistors Q1 to Q4 of the inverter 601. In one embodiment, the controller 505 asserts the drive signals according to the offset Ios between the predetermined current profile and the adjusted current profile. Driven by these drive signals, duty cycles of the switching transistors Q1 to Q4 are modulated to generate the offset current equal to the offset Ios. More specifically, as shown in FIG. 7, the drive signal for Q1 is a switching signal with a certain duty cycle. The on-level is the high-level of the drive signal and the off-level is the low-level of the drive signal in this example. Ideally, the drive signal for Q2 is opposite in phase with the drive signal for Q1 as shown in FIG. 7. In practice, in order to ensure that Q1 and Q2 in the same bridge leg do not turn on simultaneously, there is a period during which both drive signals for Q1 and Q2 are at off-level. This period is referred to as a dead time as the both transistors are at off state during this period. The drive signal for Q1 has 180° phase shift with the drive signal for Q4. And the drive signals for Q4 and Q3 in the same bridge leg has the same relationship as that of the drive signals for Q1 and Q2.

By introducing 180° phase shift between the Q1 and Q4 drive signals, the equivalent output frequency of the voltage VAB between outputs A and B may be double. The relationship between the voltage VAB and the duty cycle D of the drive signals can be described as equation (6)

$$VAB = (2D-1) \times VBus \quad (6)$$

where VBus represents the DC supply voltage for the inverter 601 as shown in FIG. 6. In order to compensate for the current offset Ios, the current injector 507 needs to generate a higher voltage than the gradient coil voltage Vcoil across the gradient coil 403 through the step up transformer 603. The gradient coil voltage Vcoil is governed by equation (7):

$$Vcoil = Lcoil \times \frac{dIcoil}{dt} + Icoil \times Rcoil \quad (7)$$

where Lcoil is the inductance of the gradient coil, Icoil is the current of the gradient coil, Rcoil is the resistance of the gradient coil. Thus, the current injector 507 needs to generate an offset voltage Vos according to equation (8):

$$Vos = Ios \times Rcoil + Vcoil \quad (8)$$

From above analysis, the turn ration between the number of two secondary windings N2 and N3 and the number of primary winding N1 can be determined by equation (9):

$$N = \frac{N2}{N1} = \frac{N3}{N1} = \frac{\frac{1}{2}Vos}{Vbus} \quad (9)$$

Figure 8A:
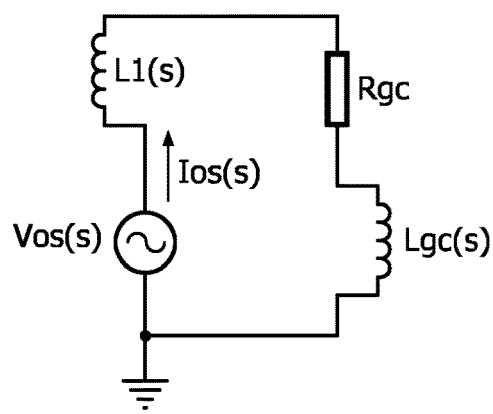
FIG. 8A illustrates an equivalent circuit model for the current injector according to one embodiment of the present invention.

FIG. 8A illustrates an equivalent circuit model for the current injector 507. The inverter 601 and the transformer 603 may be equivalent to a voltage source which output a voltage Vos(s). The inductor circuit 605 may be equivalent to an inductance L1s which supplies the offset current Ios(s) under the driving of the voltage Vos(s). The gradient coil 403 may be equivalent to a resistance Rgc and an inductance Lgc. the relationship between the output voltage Vos(s) and duty cycle d(s) can be described in S domain as equations (10), (11) and (12):

$$\frac{Vos(s)}{d(s)} = 2 \times VBus \times N \quad (10)$$

$$ios(s) \times (Lgcs + Rgc) = Vos(s) \times \frac{Lgcs + Rgc}{(Lgcs + Rgc) + L1s} \quad (11)$$

$$Gid(s) = \frac{ios(s)}{d(s)} = \frac{2Vbus \times N}{Lgcs + Rgc + L1s} \quad (12)$$

Figure 8B:
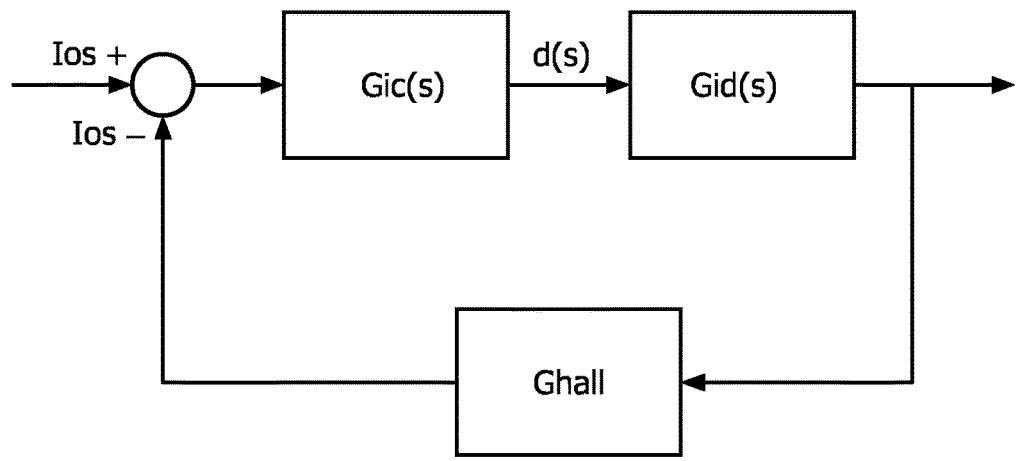
FIG. 8B illustrates an exemplary process for tracking the offset current according to one embodiment of the present invention.

FIG. 8B shows an exemplary process for tracking the offset current Ios. The process may be performed in the controller 505. It should be understood that the tracking of the offset current Ios is not limited to the specific process. Other tracking algorithm may also be used.

As shown in FIG. 8B, a proportional integral (PI) controller Gic(s) may be used to determine the duty cycle d(s) based on the derivative of the actual measured value of the offset current Ios from the reference value set by the controller 505. The bandwidth of the open loop transfer function Gol(s) is given according to equation (13):

$$Gol(s) = Gic(s) \times Gid(s) \times Ghall \quad (13)$$

where Ghall is a transfer function used to scale down the measured offset current outputted by Gid(s) to a value suitable to be processed by the PI controller Gic(s). For example, Ghall may be a constant value for scaling down the measured offset current. It should be understood that although PI controller Gic(s) is employed for current tracking in this example, other control algorithm, such as PID controller, state space controller or the like, may also be used for the purpose of the present invention.

Figure 9:
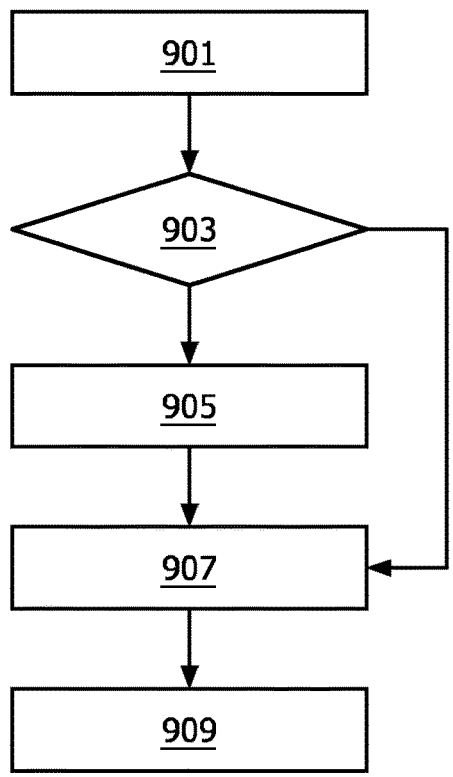
FIG. 9 illustrates a method for operating a power semiconductor device to provide a predetermined current profile to a load according to one embodiment of the present invention.

FIG. 9 illustrates a method for operating a power semiconductor device to provide a predetermined current profile to a load according to one embodiment of the present invention. FIG. 9 is described in connection with FIG. 5.

At block 901, a control signal is generated based on the predetermined current profile and a maximum junction temperature of power semiconductors of a switch mode power conversion circuit in the power semiconductor device. In one embodiment, the controller 505 in the gradient amplifier system 412 generates the control signal based on the predetermined current profile to flow through the gradient coil 403 and the maximum junction temperature of power semiconductors in the inverter power stage 501 of the gradient amplifier 510.

At block 903, the switch mode power conversion circuit is controlled to output the predetermined current profile or an adjusted current profile which has an offset with respect to the predetermined current profile in response to the control signal. In one embodiment, the gradient amplifier 510 is controlled by the control signal to output the predetermined current profile and the adjusted current profile. The adjusted current profile is shifted from the predetermined current profile by the offset current Ios. If the adjusted current profile is outputted from the switch mode power conversion circuit, the operation goes next to block 905 and 907. Otherwise, the operation goes next to block 909.

At block 905, the offset current Ios is generated. In one embodiment, the current injector 507 is activated to generate the offset current Ios if the gradient amplifier 510 outputs the adjusted current profile. At block 907, the offset current Ios is further summed with the adjusted current profile to generate the predetermined current profile to flow through the load. In one embodiment, the adjusted current profile and the offset current Ios are combined together to be delivered to the gradient coil 403.

At block 909, the predetermined current profile is delivered to the load. In one embodiment, if the gradient amplifier 510 outputs the predetermined current profile, the current injector 507 is kept in the inactivated state and the predetermined current profile is delivered to the gradient coil 403 directly.

It should be noted that the above-mentioned embodiments illustrated rather than limit the invention and that those skilled in the art would be able to design alternative embodiments without departing from the scope of the appended claims. The embodiments are illustrative rather than restrictive. It is intended that the invention include all modifications and variations to the illustrated and described embodiments within the scope and spirit of the invention. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements. In the device claims enumerating several units, several of these units can be embodied by one and the same item of hardware or software. The usage of the words first, second and third, et cetera, does not indicate any ordering. These words are to be interpreted as names.

The invention claimed is:

1. A power semiconductor device for providing a load with a predetermined current profile, comprising:
   a switch mode power conversion circuit including a plurality of power semiconductors for driving the load in response to a control signal;
   a controller coupled to the switch mode power conversion circuit to generate the control signal based on the predetermined current profile and a maximum junction temperature of the power semiconductors, wherein the switch mode power conversion circuit is controlled to output, in response to the control signal, the predetermined current profile if the junction temperature of the power semiconductors when outputting the predetermined current profile is less than the maximum junction temperature of the power semiconductors or an adjusted current profile if the junction temperature of the power semiconductors when outputting the predetermined current profile is equal to or higher than the maximum junction temperature of the power semiconductors, and wherein the adjusted current profile has an offset with respect to the predetermined current profile; and
   a current injector coupled to the controller for generating an offset current equal to the offset between the adjusted current profile and the predetermined current profile in response to the control signal, wherein the offset current and the adjusted current profile are summed to generate the predetermined current profile to flow through the load if the control signal controls the switch mode power conversion circuit to output the adjusted current profile.

2. The semiconductor device of claim 1, wherein the power semiconductors have uneven power dissipation distribution if the switch mode power conversion circuit outputs the predetermined current profile, and wherein the power semiconductors have balanced power dissipation distribution if the switch mode power conversion circuit outputs the adjusted current profile.

3. The semiconductor device of claim 1, wherein the predetermined current profile has a time duration of T1 during which the predetermined current profile flows through the load with a current level I1, and a time duration of T2 during which the predetermined current profile flows through the load with a current level I2 in a direction opposite to the current direction during the time duration of T1, and wherein the offset of the adjusted current profile with respect to the predetermined current profile is determined based on Ios=I1*D−I2(1−D) where D=T1/(T1+T2).

4. The semiconductor device of claim 1, wherein the power semiconductors are connected in a cascaded full bridge topology with a plurality of full bridge circuits in a stack configuration or a multiple bridge power conversion topology with the full bridge circuits connected in parallel.

5. The semiconductor device of claim 1, wherein the controller further comprises:
   a control signal generator which determines whether a temperature of at least one of the power semiconductors reaches the maximum junction temperature if the switch mode power conversion circuit outputs the predetermined current profile and generates the control signal according to the determination; and
   an offset current calculator coupled to the control signal generator and for calculating the offset current based on the adjusted current profile and the predetermined current profile if the control signal controls the switch mode power conversion circuit to output the adjusted current profile.

6. The semiconductor device of claim 1, wherein the current injector further comprises:
   an inverter configured to output a first voltage based on the offset of the adjusted current profile with respect to the predetermined current profile;
   a transformer coupled to the inverter for boosting the first voltage to a second voltage higher than a voltage across the load; and
   an inductor circuit driven by the second voltage to generate the offset current.

7. The semiconductor device of claim 1, wherein current ripples of the offset current are generated to cancel current ripples of the adjusted current profile during a transient stage.

8. A method for operating a power semiconductor device to provide a load with a predetermined current profile, comprising:
   generating a control signal based on the predetermined current profile and a maximum junction temperature of power semiconductors of a switch mode power conversion circuit in the power semiconductor device;
   controlling the switch mode power conversion circuit to output, in response to the control signal, the predetermined current profile if the junction temperature of the power semiconductors when outputting the predetermined current profile is less than the maximum junction temperature of the power semiconductors or an adjusted current profile which has an offset with respect to the predetermined current profile if the junction temperature of the power semiconductors when outputting the predetermined current profile is equal to or higher than the maximum junction temperature of the power semiconductors;

performing the following steps if the control signal controls the switch mode power conversion circuit to output the adjusted current profile,
generating an offset current equal to the offset between the adjusted current profile and the predetermined current profile; and
summing the offset current with the adjusted current profile to generate the predetermined current profile to flow through the load.

9. The method of claim 8, wherein the power semiconductors have uneven power dissipation distribution if the switch mode power conversion circuit outputs the predetermined current profile, and wherein the power semiconductors have balanced power dissipation distribution if the switch mode power conversion circuit outputs the adjusted current profile.

10. The method of claim 8, wherein the predetermined current profile has a time duration of T1 during which the predetermined current profile flows through the load with a current level I1, and a time duration of T2 during which the predetermined current profile flows through the load with a current level I2 in a direction opposite to the current direction during the time duration of T1, and wherein the offset of the adjusted current profile with respect to the predetermined current profile is determined based on $Ios=I1*D-I2(1-D)$ where $D=T1/(T1+T2)$.

11. The method of claim 8, further comprising:
determining whether a temperature of at least one of the power semiconductors exceeds the maximum junction temperature if the switch mode power conversion circuit outputs the predetermined current profile;
generating the control signal according to the determination; and
calculating the offset of the adjusted current profile with respect to the predetermined current profile if the control signal controls the switch mode power conversion circuit to output the adjusted current profile.

12. A gradient amplifier system for driving a gradient coil in a magnetic resonance imaging device comprising:
a gradient amplifier including a plurality of the power semiconductors for outputting a gradient current in response to a control signal;
a controller coupled to the gradient amplifier for controlling a current profile of the gradient current, wherein the controller determines the current profile of the gradient current to be a predetermined current profile if the junction temperature of the power semiconductors when outputting the predetermined current profile is less than the maximum junction temperature of the power semiconductors or an adjusted current profile if the junction temperature of the power semiconductors when outputting the predetermined current profile is equal to or higher than the maximum junction temperature of the power semiconductors, and wherein the adjusted current profile has an offset with respect to the predetermined current profile; and
a current injector coupled to the gradient amplifier and the controller for generating an offset current equal to the offset between the adjusted current profile and the predetermined current profile, wherein the offset current and the adjusted current profile are summed to generate the predetermined current profile to flow through the gradient coil if the gradient amplifier outputs the gradient current with the adjusted current profile.

13. The gradient amplifier system of claim 12, wherein the gradient amplifier further comprises a switch mode power stage with a plurality of bridge circuits, each bridge circuit including a high-side power semiconductor and a low-side power semiconductor coupled in series.

14. The gradient amplifier system of claim 12, wherein the predetermined current profile has a time duration of T1 during which the predetermined current profile flows through the gradient coil with a current level I1, and a time duration of T2 during which the predetermined current profile flows through the gradient coil with a current level I2 in a direction opposite to the current direction during the time duration of T1, and wherein the offset of the adjusted current profile with respect to the predetermined current profile is determined based on $Ios=I1*D-I2(1-D)$ where $D=T1/(T1+T2)$.

15. A magnetic resonance imaging device comprising the gradient amplifier system according to claim 12.

* * * * *